(12) United States Patent
Takahashi

(10) Patent No.: US 10,838,011 B2
(45) Date of Patent: Nov. 17, 2020

(54) METHOD FOR ESTIMATING STATE OF CHARGE AND ON-VEHICLE BATTERY SYSTEM

(71) Applicant: TOYOTA JIDOSHA KABUSHIKI KAISHA, Toyota-shi, Aichi-ken (JP)

(72) Inventor: Kenji Takahashi, Toyota (JP)

(73) Assignee: TOYOTDA JIDOSHA KABUSHIKI KAISHA, Aichi-ken (JP)

( * ) Notice: Subject to any disclaimer, the term of this patent is extended or adjusted under 35 U.S.C. 154(b) by 240 days.

(21) Appl. No.: 15/963,531

(22) Filed: Apr. 26, 2018

(65) Prior Publication Data

US 2018/0313905 A1    Nov. 1, 2018

(30) Foreign Application Priority Data

Apr. 27, 2017  (JP) .................................. 2017-088149

(51) Int. Cl.
*G01N 27/416*   (2006.01)
*G01R 31/367*   (2019.01)
*G01R 31/3842*  (2019.01)

(52) U.S. Cl.
CPC ....... *G01R 31/367* (2019.01); *G01R 31/3842* (2019.01)

(58) Field of Classification Search
CPC .. G01R 31/367; G01R 31/374; G01R 31/379; G01R 31/382; G01R 31/387; G01R 31/389; G01R 31/392; G01R 31/3842; G01R 31/3606; G01R 31/3624; G01R 31/3634; G01R 31/3648; G01R 31/3651; G01R 31/3662; G01R 31/3665; G01R 31/3675; G01R 31/3679
See application file for complete search history.

(56) References Cited

U.S. PATENT DOCUMENTS

| | | | |
|---|---|---|---|
| 2009/0256524 A1* | 10/2009 | Nukui | G01R 31/388 320/132 |
| 2010/0085057 A1 | 4/2010 | Nishi et al. | |
| 2014/0278167 A1* | 9/2014 | Frost | B60L 3/0038 702/63 |
| 2015/0291050 A1* | 10/2015 | Luo | B60L 11/1861 320/162 |
| 2015/0355285 A1 | 12/2015 | Nishigaki et al. | |

(Continued)

FOREIGN PATENT DOCUMENTS

| | | |
|---|---|---|
| JP | 2005-261130 A | 9/2005 |
| JP | 2008-243373 A | 10/2008 |

(Continued)

*Primary Examiner* — Thang X Le
(74) *Attorney, Agent, or Firm* — Sughrue Mion, PLLC

(57) ABSTRACT

A method for estimating a state of charge of a battery includes: estimating, by an electronic control unit, a third state of charge used for control of the battery based on a first state of charge and a second state of charge, the first state of charge being a state of charge estimated with reference to an electric current integrated value obtained by integrating detected electric current values of the battery, the second state of charge being a state of charge estimated with reference to a detected voltage value of the battery; and correcting, by the electronic control unit, the first state of charge based on the second state of charge estimated when the state of charge of the battery is in the non-hysteresis region.

7 Claims, 9 Drawing Sheets

(56) References Cited

U.S. PATENT DOCUMENTS

| | | | | |
|---|---|---|---|---|
| 2015/0369873 A1* | 12/2015 | Nakao | ................ | G01R 31/3648 702/63 |
| 2017/0261560 A1* | 9/2017 | Goto | .................. | H01M 10/486 |
| 2018/0074129 A1* | 3/2018 | Nakao | .................. | G01R 31/367 |

FOREIGN PATENT DOCUMENTS

| | | |
|---|---|---|
| JP | 2014-059206 A | 4/2014 |
| JP | 2014-139521 A | 7/2014 |

\* cited by examiner

FIG. 4

| DEFINITION OF SUBSCRIPTS | e: ELECTROLYTE  j = 1: POSITIVE ELECTRODE |
|---|---|
|  | s: ACTIVE MATERIAL  j = 2: NEGATIVE ELECTRODE |

| Symbol | Description |
|---|---|
| $c_{ej}$ | Li CONCENTRATION IN ELECTROLYTE |
| $c_{sj}$ | Li CONCENTRATION IN ACTIVE MATERIAL |
| $c_{sj.max}$ | LIMIT Li CONCENTRATION |
| $c_{sej}$ | Li CONCENTRATION IN ACTIVE MATERIAL INTERFACE |
| $\phi_{ej}$ | ELECTRIC POTENTIAL OF ELECTROLYTE |
| $\phi_{sj}$ | ELECTRIC POTENTIAL OF ACTIVE MATERIAL |
| $T$ | ABSOLUTE TEMPERATURE |
| $j_j^{Li}$ | Li PRODUCTION AMOUNT (REACTION CURRENT DENSITY) PER UNIT VOLUME AND UNIT TIME    $I = \int j_j^{Li} dv$ |
| $\alpha_{aj}$ | TRANSFER COEFFICIENT (OXIDATION REACTION) OF ELECTRODE REACTION $j_j^{Li}$ |
| $\alpha_{cj}$ | TRANSFER COEFFICIENT (REDUCTION REACTION) OF ELECTRODE REACTION $j_j^{Li}$    $a_{aj} + a_{cj} = 1$ |
| $F$ | FARADAY CONSTANT |
| $i_{0j}$ | EXCHANGE CURRENT DENSITY |
| $\eta_j$ | OVERVOLTAGE OF ELECTRODE REACTION $j_j^{Li}$ |
| $U_j$ | OCV (OPEN-CIRCUIT VOLTAGE) |
| $\theta_j$ | LOCAL SOC IN ACTIVE MATERIAL INTERFACE    $\theta_j = \dfrac{c_{sej}}{c_{sj.max}}$ |
| $R_f$ | COAT RESISTANCE ON ELECTRODE SURFACE |
| $t_+^0$ | Li ION TRANSPORT NUMBER |
| $D_{sj}$ | ACTIVE MATERIAL DIFFUSION COEFFICIENT |
| $D_{ej}^{eff}$ | ELECTROLYTE EFFECTIVE DIFFUSION COEFFICIENT |
| $a_{sj}$ | ACTIVE MATERIAL SURFACE AREA PER UNIT VOLUME OF ELECTRODE |
| $r_{sj}$ | ACTIVE MATERIAL RADIUS |
| $\varepsilon_{sj}$ | VOLUME FRACTION (ACTIVE MATERIAL)    $\varepsilon_s + \varepsilon_e + \varepsilon_p + \varepsilon_f = 1$ |
| $\varepsilon_{ej}$ | VOLUME FRACTION (ELECTROLYTE) |
| $K_j^{eff}$ | EFFECTIVE IONIC CONDUCTIVITY OF ELECTROLYTE |
| $K_{Dj}^{eeff}$ | DIFFUSION CONDUCTIVITY OF ELECTROLYTE |
| $\sigma_j^{eff}$ | EFFECTIVE CONDUCTIVITY OF ACTIVE MATERIAL |
| $I$ | CURRENT DENSITY (PER UNIT SURFACE AREA OF PLATE) |
| $L_j$ | ELECTRODE THICKNESS |

METHOD FOR ESTIMATING STATE OF CHARGE AND ON-VEHICLE BATTERY SYSTEM

INCORPORATION BY REFERENCE

The disclosure of Japanese Patent Application No. 2017-088149 filed on Apr. 27, 2017 including the specification, drawings and abstract is incorporated herein by reference in its entirety.

BACKGROUND

1. Technical Field

The present specification discloses a method for estimating a state of charge of a battery, and a battery system having a function of estimating the state of charge, the battery being mounted on a vehicle and configured to be chargeable and dischargeable.

2. Description of Related Art

Electric motor vehicles equipped with a rotary electric machine as one of the driving sources are widely known. Such electric motor vehicles are equipped with a battery system having a chargeable and dischargeable secondary battery. The secondary battery supplies electric power to the rotary electric machine when the rotary electric machine is driven as an electric motor. When the rotary electric machine is driven as an electric generator, the secondary battery stores the generated electric power. The battery system controls charge and discharge of the secondary battery such that a so-called state of charge (SOC) of the secondary battery does not exceed a prescribed upper limit (sufficiently lower than 100%) and does not fall below a prescribed lower limit (sufficiently higher than 0%). In order to perform such control, it is desired in the battery system to correctly estimate the state of charge of the secondary battery.

Generally, the state of charge of the secondary battery is estimated with reference to a voltage value or an electric current integrated value of the secondary battery. As methods for estimating the state of charge with reference to the voltage value, methods such as those using an SOC-OCV curve and those using a battery model are known. The SOC-OCV curve represents an open-circuit voltage value of the secondary battery with respect to the state of charge. For example, when the open-circuit voltage value of the secondary batter can be obtained, the battery system applies the obtained open-circuit voltage to the SOC-OCV curve to estimate the current state of charge (for example, Japanese Patent Application Publication No. 2014-059206 and the like). The method using the battery model has also been proposed (for example, Japanese Patent Application Publication No. 2008-243373). In the method, the state of the secondary battery is estimated as required, and the state of charge is estimated based on the result of the estimation. In the method, a boundary condition of the battery model is updated as required with use of a parameter such as a detected voltage value. Hereinafter, the state of charge estimated by the methods involving reference to the voltage value is called "voltage-derived state of charge." As a method for estimating the state of charge with reference to the electric current integrated value, there is a method that estimates not only a change amount of the state of charge but also a current state of charge based on, for example, comparison between the electric current integrated value and full-charge capacity of the secondary battery. Hereinafter, the state of charge estimated by the method involving reference to the electric current integrated value is called "electric current-derived state of charge."

SUMMARY

In some secondary batteries, a significant hysteresis occurs in some range of the state of charge of the battery, the hysteresis being a difference of a fixed value or more between open-circuit voltage values with respect to the state of charge after continuation of charging and after continuation of discharging. For example, in the case of a lithium-ion secondary battery having a negative electrode active material that contains a silicon-based material and graphite, it is known that an open-circuit voltage value after continuation of charging is different from an open-circuit voltage value after continuation of discharging even though the SOC is identical in a low SOC region.

When the state of charge of the secondary battery is in the region of occurrence of the hysteresis, a unique correspondence relation is not established between the voltage value and the state of charge. This may cause deterioration in accuracy of the voltage-derived state of charge estimated with reference to the voltage value. Meanwhile, the electric current-derived state of charge estimated with reference to the electric current integrated value is less susceptible to the influence of the hysteresis. However, the electric current integrated value and by extension, the electric current-derived state of charge are disadvantageous in the point that an integration error derived from a current sensor becomes larger as the period of integrating the electric current becomes longer.

In short, the estimation accuracy of the voltage-derived state of charge deteriorates due to the influence of the hysteresis, whereas the estimation accuracy of the electric current-derived state of charge deteriorates due to the influence of the integration error derived from the current sensor. Accordingly, the present specification provides a method for estimating a state of charge and a battery system capable of achieving further enhancement in the estimation accuracy of the state of charge.

As an example aspect of the present disclosure is a method for estimating a state of charge of a battery. The battery is mounted on a vehicle and configured to perform charge and discharge, a charge level range of the battery includes a hysteresis region and a non-hysteresis region, the hysteresis region is a charge level range where a significant hysteresis occurs, the significant hysteresis is hysteresis in which open-circuit voltage values with respect to a charge level of the battery after continuation of charging and after continuation of discharging are different from each other by a predetermined value or more, the non-hysteresis region being a charge level range where the significant hysteresis does not occur. The vehicle includes an electronic control unit. The method includes: estimating, by the electronic control unit, a third state of charge used for control of the battery based on a first state of charge and a second state of charge, the first state of charge being a state of charge estimated with reference to an electric current integrated value obtained by integrating detected electric current values of the battery, the second state of charge being a state of charge estimated with reference to a detected voltage value of the battery; and correcting, by the electronic control unit, the first state of charge based on the second state of charge estimated when the state of charge of the battery is in the non-hysteresis region.

The voltage-derived state of charge has a low reliability in the hysteresis region, but has a high reliability in the non-hysteresis region. When the electric current-derived state of charge is corrected based on the highly reliable voltage-derived state of charge that is estimated in the non-hysteresis region, the estimation accuracy of the electric current-derived state of charge can be further enhanced. As a result, the estimation accuracy of the state of charge can be further enhanced.

The method may further include: determining, by the electronic control unit, whether or not to correct the first state of charge; and controlling, by the electronic control unit, charge and discharge of the battery to forcibly shift the state of charge of the battery to the non-hysteresis region, when the electronic control unit determines that correcting the first state of charge is necessary.

With such configuration, the timing of correcting the electric current-derived state of charge can more reliably be grasped.

Determining whether or not to correct the first state of charge includes determining whether or not to correct the first state of charge based on at least one of lapsed time after execution of a previous correction of the first state of charge and the integrated electric current value after execution of the previous correction of the first state of charge.

With such a configuration, correction can be executed before an error of the electric current-derived state of charge becomes too large. Therefore, the estimation accuracy of the state of charge can be further be enhanced.

The battery may be mounted on one of a hybrid vehicle and a fuel cell electric vehicle, the hybrid vehicle may be equipped with an engine and a rotary electric machine as a power source, the fuel cell electric vehicle may be equipped with a fuel cell. The battery may be configured to supply electric power to the rotary electric machine.

In the case of the hybrid vehicle, motive power for traveling of the vehicle and for charging can be obtained from the engine. Accordingly, the state of charge of the battery can be easily shifted even during traveling of the vehicle. As a result, the timing of correcting the electric current-derived state of charge can more reliably be grasped.

In estimating the state of charge, the third state of charge may be calculated as a value obtained by weighing and adding the first state of charge and the second state of charge, and when the state of charge is within the hysteresis region, an addition ratio of the first state of charge may be larger than the addition ratio of the second state of charge.

In that case, in the hysteresis region where the reliability of the voltage-derived state of charge is low, the addition ratio of the electric current-derived state of charge becomes larger. Accordingly, the reliability of the state of charge in the hysteresis region can be further enhanced.

The addition ratio of the second state of charge may be larger when the state of charge is in the hysteresis region than when the state of charge is in the non-hysteresis region.

In that case, since the addition ratio of the voltage-derived state of charge becomes larger in the non-hysteresis region where the reliability of the voltage-derived state of charge is high, the reliability of the state of charge in the non-hysteresis region can further be enhanced.

As an aspect example of the present disclosure is a battery mounted on a vehicle and configured to perform charge and discharge, a charge level range of the battery including a hysteresis region and a non-hysteresis region, the hysteresis region being a charge level range where a significant hysteresis occurs, the significant hysteresis being hysteresis in which open-circuit voltage values with respect to a charge level of the battery after continuation of charging and after continuation of discharging are different from each other by a predetermined value or more, the non-hysteresis region being a charge level range where the significant hysteresis does not occur; a voltage detector configured to detect a voltage value of the battery as a detected voltage value; a current detector configured to detect a value of electric current flowing through the battery as a detected electric current value; and an electronic control unit configured to control the charge and discharge of the battery and to estimate a current state of charge, estimate the current state of charge as a first state of charge with reference to an electric current integrated value obtained by integrating the detected electric current values, estimate the current state of charge as a second state of charge with reference to the detected voltage value, and correct the first state of charge based on the second state of charge estimated with reference to the detected voltage value detected when the state of charge of the battery is in the non-hysteresis region.

The voltage-derived state of charge has a low reliability in the hysteresis region, but has a high reliability in the non-hysteresis region. When the electric current-derived state of charge is corrected based on the highly reliable voltage-derived state of charge that is estimated in the non-hysteresis region, the estimation accuracy of the electric current-derived state of charge can further be enhanced. As a result, the estimation accuracy of the state of charge can further be enhanced.

In the technique disclosed in the present description, when the electric current-derived state of charge is corrected based on the highly reliable voltage-derived state of charge estimated when the state of charge is in the non-hysteresis region, the estimation accuracy of the electric current-derived state of charge can further be enhanced. As a result, the estimation accuracy of the state of charge can further be enhanced.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 4 is a table illustrating parameters used for battery model expressions;

DETAILED DESCRIPTION OF EMBODIMENTS

Figure 1:
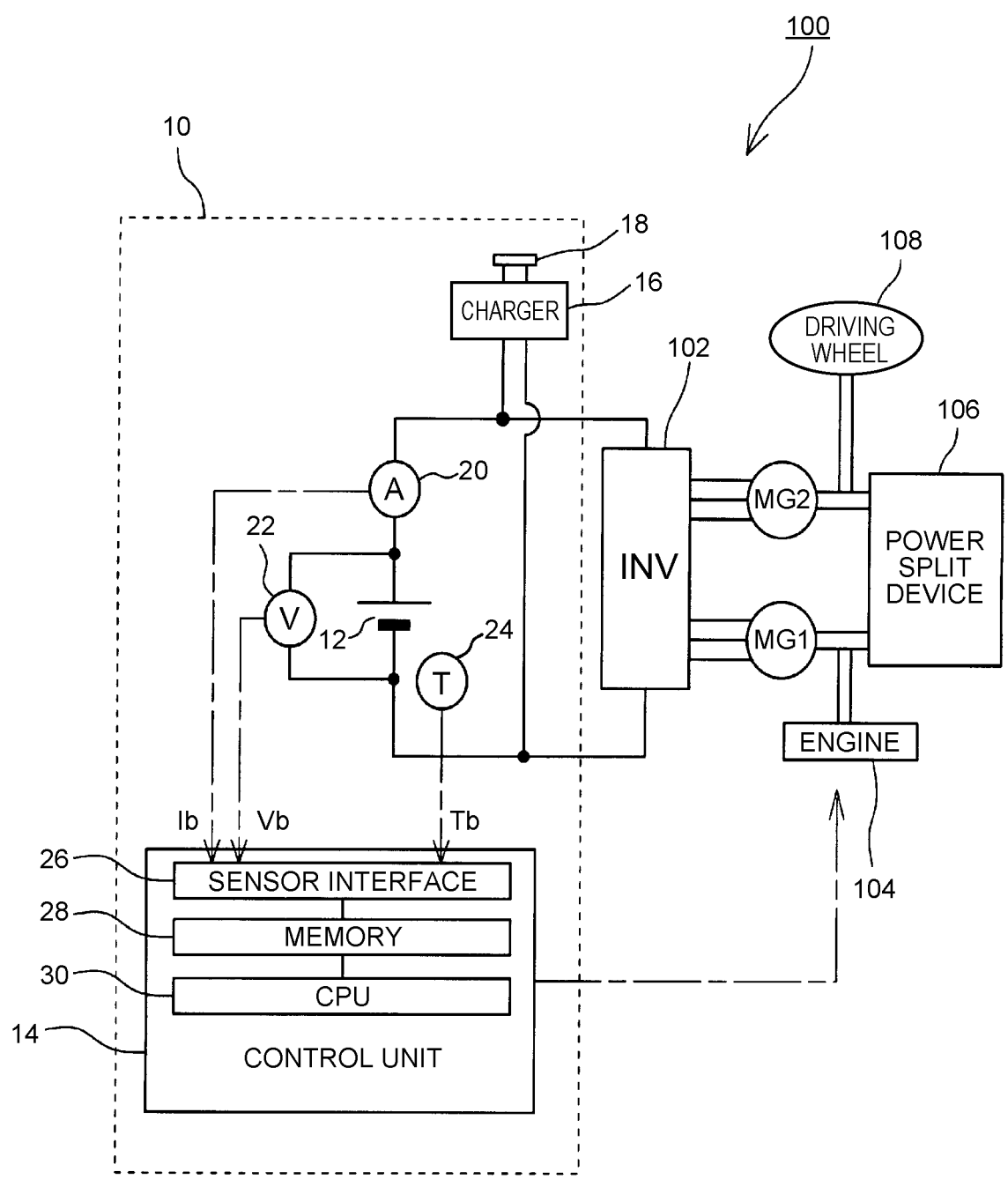
FIG. 1 illustrates the configuration of an electric motor vehicle equipped with a battery system.

Hereinafter, the configuration of a battery system 10 will be described with reference to the drawings. FIG. 1 illustrates a schematic structure of an electric motor vehicle 100 equipped with a battery system 10. The electric motor vehicle 100 is a hybrid vehicle including two rotary electric machines MG1, MG2, and one engine 104 as power sources.

The engine 104 is connected to a power split device 106 composed of a planetary gear and the like. The planetary gear splits and transmits the motive power of the engine 104 to a driving wheel 108 and the first rotary electric machine MG1. The two rotary electric machines MG1, MG2 each function as an electric generator and also as an electric motor. The second rotary electric machine MG2 has an output shaft coupled with the driving wheel 108. The second rotary electric machine MG2 mainly functions as an electric motor. During traveling of the vehicle, the second rotary electric machine MG2 supplies driving torque to the driving wheel 108. The second rotary electric machine MG2 also functions as an electric generator that generates electric power with braking force at the time of braking of the vehicle. The first rotary electric machine MG1 mainly functions as an electric generator. The first rotary electric machine MG1 is coupled with the power split device 106 to receive surplus motive power of the engine 104 for power generation. The first rotary electric machine MG1 also functions as a starter motor for starting up the engine 104.

The inverter 102 converts direct-current electric power into alternating-current electric power, and also converts alternating current electric power into direct-current electric power. Specifically, the inverter 102 converts the direct-current electric power supplied from the later-described battery 12 into alternating-current electric power, and outputs the alternating-current electric power to the first and second rotary electric machines MG1, MG2 that drive as electric motors. The inverter 102 also converts the alternating-current electric power, generated in the first and second rotary electric machines MG1, MG2 that drive as electric generators, into direct-current electric power, and supplies the direct-current electric power to the battery 12. Between the inverter 102 and the battery 12, a transformer may be provided to step up or step down the electric power. Component members such as the inverter 102, the rotary electric machines MG1, MG2, and the engine 104 are controlled by a control unit (electronic control unit) 14.

The battery system 10 includes a chargeable and dischargeable battery 12. The battery 12 is a secondary battery that supplies electric power for driving the rotary electric machines MG1, MG2, and stores electric power generated in the rotary electric machines MG1, MG2. The battery 12 has a plurality of cells connected in series or in parallel. As the battery 12, various types of batteries may be considered. In the present embodiment, used as the battery 12 is a lithium-ion secondary battery having a complex containing a silicon-based material and graphite as a negative electrode active material. When the battery 12 has the complex containing a silicon-based material and graphite as a negative electrode active material, a change characteristic of an open-circuit voltage value Vo with respect to a state of charge C has a hysteresis in some range of the state of charge. The change characteristic will be described later. The state of charge C is a value (%) obtained by multiplying a current charge capacity with respect to a full-charge capacity FCC of the battery 12 by 100%. The state of charge C is generally referred to as SOC.

In order to identify the state of the battery 12, the battery system 10 includes sensors such as an electric current sensor 20, a voltage sensor 22, and a temperature sensor 24. The electric current sensor 20 detects an electric current value input to and output from the battery 12. The detected electric current value is input into the control unit 14 as a detected electric current value Ib. The electric current sensor 20 detects discharging electric current as a positive value and charging electric current as a negative value. The voltage sensor 22 detects a voltage value across the terminals of the battery 12. The detected voltage value is input into the control unit 14 as a detected voltage value Vb. The battery 12 is generally an assembled battery having a plurality of cells connected in series or in parallel. Accordingly, the voltage sensor 22 may be provided for each of the cells, or may be provided for each block composed of a plurality of cells. Or only one voltage sensor 22 may be provided for the entire assembled battery. The temperature sensor 24 detects the temperature of the battery 12. The detected temperature is input into the control unit 14 as a battery temperature Tb. The number of the temperature sensors 24 may be one, or may be two or more. When a plurality of voltage sensors 22 or temperature sensors 24 are provided, a statistic of the detection values of the voltage sensors 22 or the temperature sensor 24, such as an average value, a maximum value, and a minimum valve, may be treated as the detected voltage value Vb or the battery temperature Tb.

The battery system 10 further has a charger 16 and a connector 18 for external charging of the battery 12. The external charging refers to charging of the battery 12 with electric power from an external power source (for example, a commercial power source) provided in the outside of the hybrid vehicle 100. The connector 18 is connectable with a connector (what is called a charge plug) of the external power source. The charger 16 converts external electric power (alternating-current electric power) supplied through the connector 18 into direct-current electric power, and supplies the electric power to the battery 12.

The control unit 14 controls driving of the driving source of the component members such as the rotary electric machines MG1, MG2 and the engine 104, and also controls charge and discharge of the battery 12. The control unit 14 includes component members such as a sensor interface 26, a memory 28, and a CPU 30. The sensor interface 26 is connected to various sensors 20, 22, 24. The sensor interface 26 outputs control signals to the various sensors 20, 22, 24, and converts the data input from the various sensors 20, 22, 24 into data in a signal format processable in the CPU 30. The memory 28 stores various control parameters and various programs. The CPU 30 performs variety of information processing and calculation. The sensor interface 26, the CPU 30, and the memory 28 are connected with each other through a data bus. Although the control unit 14 is illustrated as one block in FIG. 1, the control unit 14 may be composed of a plurality of devices (such as a plurality of CPUs 30, and a plurality of memories 28). Some functions of the control unit 14 may be implemented by external devices provided in the outside of the vehicle, the external devices being able to wirelessly communicate with the control unit provided in the inside of vehicle.

The control unit 14 controls the charge and discharge of the battery 12 such that the state of charge C of the battery 12 falls within a specified target range. In order to achieve such control, the control unit 14 periodically estimates and monitors the state of charge C of the battery 12.

Figure 2:
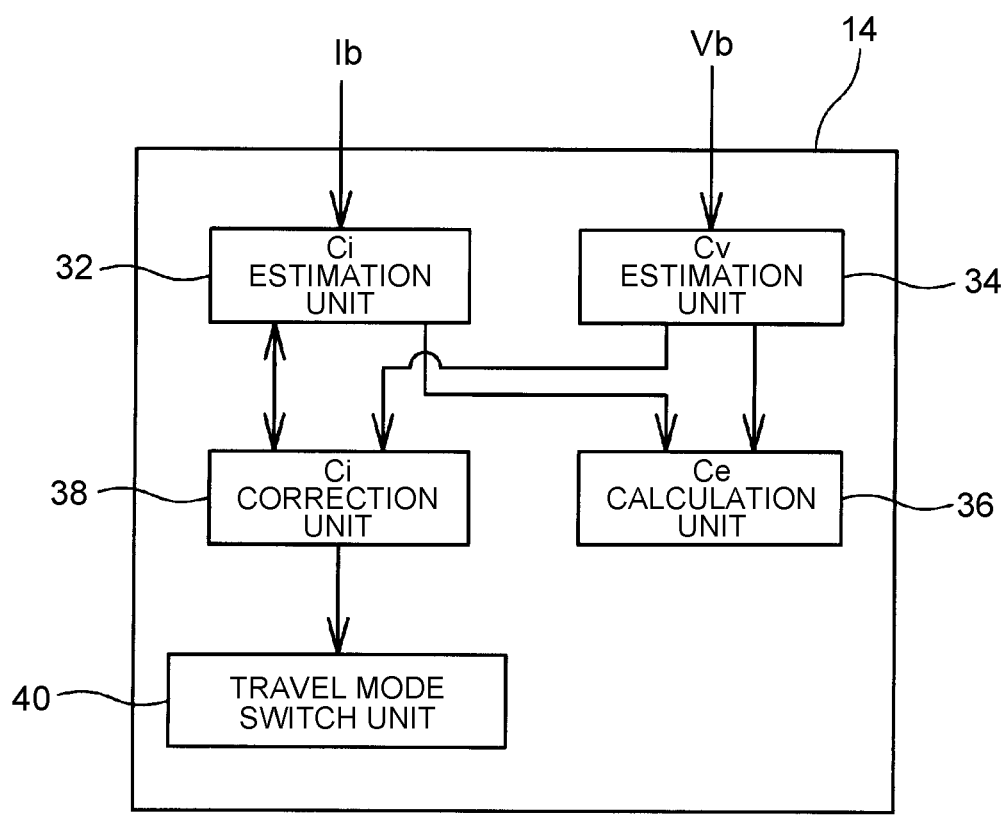
FIG. 2 is a functional block diagram of a control unit.

The estimation of the state of charge C is described with reference to FIG. 2. FIG. 2 is a functional block diagram of the control unit 14. Although FIG. 2 illustrates only the functions involved in the estimation of the state of charge, the control unit 14 has unillustrated various functions in actuality.

The control unit 14 includes a Ci estimation unit 32, a Cv estimation unit 34, and a Ce calculation unit 36. The Ci estimation unit 32 estimates an electric current-derived state of charge (first state of charge) Ci. The electric current-derived state of charge Ci is a state of charge estimated with reference to the detected electric current value Ib, or an electric current integrated value ΔAh obtained by integrating the detected electric current values Ib to be more specific. The electric current-derived state of charge Ci is estimated by adding a change amount ΔC of the state of charge to a starting state of charge C_0 that is the state of charge at integrating start time. That is, the Ci estimation unit 32 performs calculation of Ci=C_0+ΔC.

The change amount ΔC of the state of charge can be expressed as a ratio of the electric current integrated value ΔAh to the full-charge capacity FCC: ΔC=(ΔAh/FCC)×100. The electric current integrated value ΔAh is expressed as ΔAh=Σ(Ib×Δt)/3600, where Δt is a sampling cycle of the detected electric current value Ib. The full-charge capacity FCC of the battery 12 is stored in the memory 28. The control unit 14 may have a correcting function for estimating long term deterioration of the battery 12 and correcting the change of the full-charge capacity FCC in accordance with the long term deterioration.

The Cv estimation unit 34 estimates a voltage-derived state of charge (second state of charge) Cv. The voltage-derived state of charge Cv is the state of charge estimated with reference to the detected voltage value Vb. A method for estimating the voltage-derived state of charge Cv may have some variations.

Figure 3:
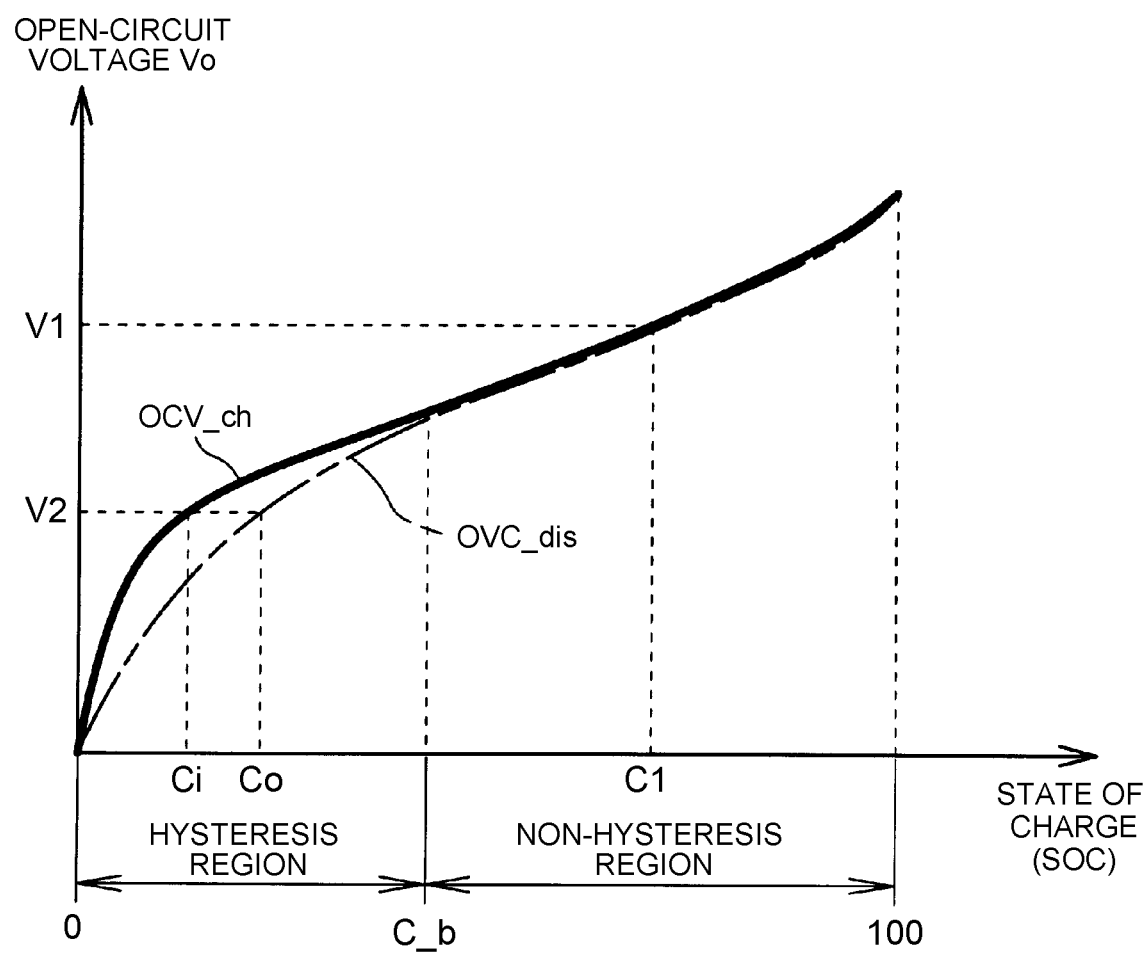
FIG. 3 illustrates one example of an SOC-OCV curve.

For example, the voltage-derived state of charge Cv may be estimated by applying the open-circuit voltage value Vo to a SOC-OCV curve. The SOC-OCV curve represents a change characteristic of the open-circuit voltage value Vo with respect to the state of charge C. FIG. 3 illustrates one example of the SOC-OCV curve. In FIG. 3, a horizontal axis represents the state of charge C (SOC) of the battery 12, and a vertical axis represents the open-circuit voltage value Vo (OCV) of the battery 12. Such a SOC-OCV curve is stored in the memory 28. The SOC-OCV curve, like the full-charge capacity FCC, may be corrected in accordance with the long term deterioration of the battery 12.

The Cv estimation unit 34 acquires the open-circuit voltage value Vo from the detected voltage value Vb, and applies the open-circuit voltage value Vo to the SOC-OCV curve stored in the memory 28. The Cv estimation unit 34 then acquires as the voltage-derived state of charge Cv a state of charge C obtained by application of the open-circuit voltage value Vo. For example, in the example of FIG. 3, the voltage-derived state of charge Cv=C1 when the open-circuit voltage value Vo=V1.

The open-circuit voltage value Vo is a voltage across the terminals of the battery 12 in the state (depolarized state) where polarization does not occur in the battery 12. The open-circuit voltage value Vo used for various calculations may be an actual measurement value or may be an estimated value. Therefore, when the charge and discharge of the battery 12 is stopped and polarization is eliminated for a fixed period, the detected voltage value Vb detected by the voltage sensor 22 may be treated as the open-circuit voltage value Vo. In the case where polarization occurs, but electric current flowing through the battery 12 is minute and so a polarization component can be estimated with sufficient accuracy, a corrected value obtained by eliminating an influence of polarization from the detected voltage value Vb detected by the voltage sensor 22 may be treated as the open-circuit voltage value Vo. Examples of the state where the electric current flowing through the battery 12 is minute may include the state where the vehicle is traveling only with the motive power of the engine 104 while the rotary electric machines MG1, MG2 are mostly stopped, and the state where the vehicle itself stops due to waiting at stoplights.

Various methods for acquiring the open-circuit voltage value Vo by eliminating the influence of polarization from the detected voltage value Vb have been proposed. For example, the open-circuit voltage value Vo may be estimated based on model expressions schematically representing the internal state of the battery 1. The voltage-derived state of charge Cv may be estimated with use of the battery model (without referring to the SOC-OCV curve). Various battery model expressions have conventionally been known. For example, a battery model disclosed in JP 2008-243373 A may be used. The battery model is constituted based on Butler-Volmer equation. The battery model includes an active material diffusion model expression which defines lithium concentration distribution in the active materials of the negative electrode and the positive electrode, and a voltage-current model relational expression indicating the relation between voltage and electric current of the battery 12. Expression (1) indicates the voltage-current model relational expression, and Expression (2) indicates one example of the active material diffusion model expression. Expression (3) and Expression (4) indicate boundary conditions of the active material diffusion model expression.

$$V(t) = U_1 \#(\theta_1, t) - U_2 \#(\theta_2, t) + \frac{RT}{\alpha_{a1} F} \quad (1)$$

$$\left\{ \arcsin h\left(\frac{-I(t)}{2L_1 a_{s1} i_{01}(\theta_1, T, t)}\right) - \arcsin h\left(\frac{I(t)}{2L_2 a_{s2} i_{02}(\theta_2, T, t)}\right) \right\} -$$

$$I(t) \underbrace{\left( \frac{L_1}{3\kappa_1^{eff}} + \frac{L_s}{3\kappa_s^{eff}} + \frac{L_2}{3\kappa_2^{eff}} + \frac{L_3}{3\sigma_1^{eff}} + \frac{L_2}{3\sigma_2^{eff}} \right)}_{Rd(T)}$$

$$\frac{\partial c_{s1}(r_1, t)}{\partial t} = D_{s1}(T) \left[ \frac{\partial^2 c_{s1}}{\partial r_1^2} + \frac{2}{r_1} \cdot \frac{\partial c_{s1}}{\partial r_1} \right] \quad (2)$$

$$\frac{\partial c_{s2}(r_2, t)}{\partial t} = D_{s2}(T) \left[ \frac{\partial^2 c_{s2}}{\partial r_2^2} + \frac{2}{r_2} \cdot \frac{\partial c_{s2}}{\partial r_2} \right]$$

$$\left. \frac{\partial c_{sj}(r_j, t)}{\partial r} \right|_{r_j=0} = 0 \quad (3)$$

$$\left. \frac{\partial [\varepsilon_{xj} \cdot c_{sj}(r_j, t)]}{\partial t} \right|_{r_j=r_{ij}} = -\frac{j_j^{Li} \#(\theta_j, t)}{a_{sj} F} \quad (4)$$

In variables and constants in the model expressions, a subscript e indicates that the pertinent value is a value in electrolyte, and a subscript s indicates that the pertinent value is a value in an active material. A subscript j is used to distinguish between the positive electrode and the negative electrode such that j=1 indicates a value in the positive electrode, and j=2 indicates a value in the negative electrode. To collectively express variables or constants in the positive electrode and the negative electrode, the subscript j is omitted. A symbol # attached to the variables or constants expresses an average value.

In the model expressions, t indicates time, T indicates battery temperature, θ indicates a local state of charge, and Ds indicates a diffusion coefficient. The diffusion coefficient Ds is a value dependent on the battery temperature T. A map of the diffusion coefficient Ds with respect to the battery temperature T is stored in the memory 28. Other parameters are as illustrated in FIG. 4.

Figure 5:
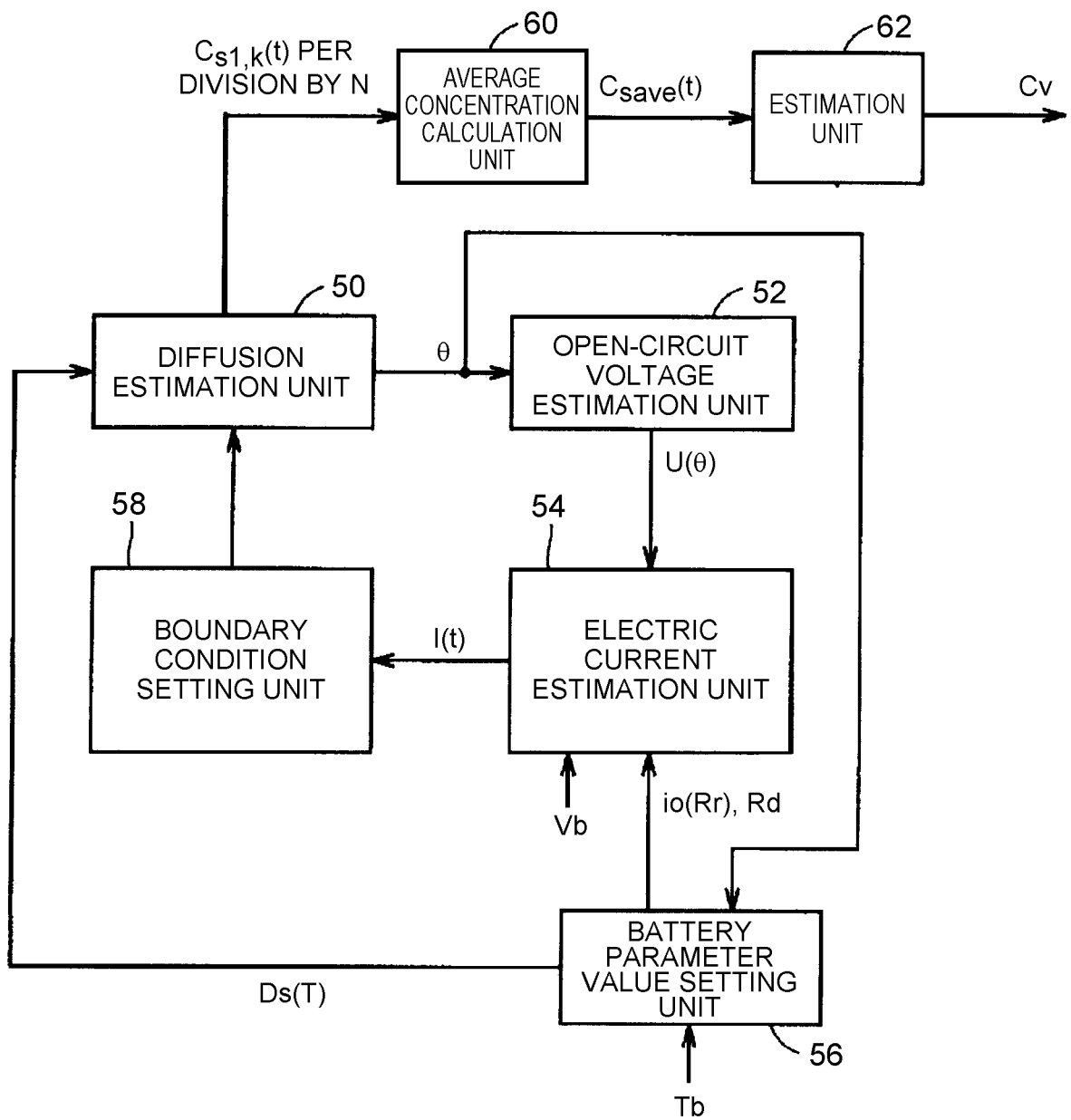
FIG. 5 illustrates one example of the configuration of a Cv estimation unit.

FIG. 5 is a block diagram illustrating one example of the configuration of the Cv estimation unit 34 that uses the battery model expressions. The Cv estimation unit 34 includes a diffusion estimation unit 50, an open-circuit voltage estimation unit 52, an electric current estimation unit 54, a battery parameter value setting unit 56, a boundary condition setting unit 58, an average concentration calculation unit 60, and an estimation unit 62.

The diffusion estimation unit 50 successively calculates the lithium concentration distribution within the active material, for example, in a difference scheme based on Active Material Diffusion Model Expression (2) and based on the boundary conditions set by the boundary condition setting unit 58 in accordance with Expression (3) and Expression (4). Based on the lithium concentration distribution estimated by the diffusion estimation unit 50, the local state of charge θ is set with the lithium concentration in an outermost peripheral region as a lithium concentration $c_{sej}$ in a material interface.

The open-circuit voltage estimation unit 52 obtains both the open-circuit voltages in the positive electrode and the negative electrode, or an open-circuit voltage composed of the open-circuit voltages in the positive electrode and the negative electrode. In FIG. 5, the open-circuit voltages are collectively expressed as an open-circuit voltage U(θ).

The battery parameter value setting unit 56 sets the battery parameters in the battery model expressions to be used, in accordance with the battery temperature Tb detected with the temperature sensor 24, and the current local state of charge θ based on the estimation by the diffusion estimation unit 50.

The electric current estimation unit 54 substitutes the open-circuit voltage estimated by the open-circuit voltage estimation unit 52 and the detected voltage value Vb detected by the voltage sensor 22 into U(θ) and battery voltage V(t) in Expression (1) to calculate a battery current density I(t).

Next, the boundary condition setting unit 58 converts the calculated current density I(t) into a reaction current density (lithium formation amount) $j_j^{Li}$, and then substitutes the obtained reaction current density (lithium formation amount) $j_j^{Li}$ into Expression (4) to update the boundary conditions of Active Material Diffusion Model Expression (2).

Therefore, in this case, with use of the detected voltage value Vb detected by the voltage sensor 22 and the battery temperature Tb detected by the temperature sensor 24 as input values, the Cv estimation unit 34 can estimate the concentration distribution of the reactant (lithium) in the active material based on Diffusion Model Expression (2) for the reactant (lithium) in the active material and based on Simplified Voltage-Electric Current Relational Model Expression (1) in accordance with an electrochemical reaction model expression. Based on the concentration distribution, the Cv estimation unit 34 can estimate the internal state of the secondary battery with high accuracy.

The average concentration calculation unit 60 obtains an average lithium concentration $c_{save}(t)$ in the positive active material model estimated by the diffusion estimation unit 50 based on Expression (5). Furthermore, the estimation unit 62 generates an estimated state of charge SOC # of the entire battery 12 as a voltage-derived state of charge Cv in accordance with Expression (6). In Expression (6), $C_o$ is an average lithium concentration when the battery is fully discharged (C=0%), and $C_f$ is an average lithium concentration when the battery is fully charged (C=100%). The values of $C_o$ and $C_f$ are stored in the memory 28 in advance.

$$c_{save}(t) = \sum_{k=1}^{N} c_{s1,k}(t) \cdot \frac{\Delta V_k}{V} \quad (5)$$

$$SOC\# = \frac{C_o - c_{save}(t)}{C_o - C_f} \cdot 100(\%) \quad (6)$$

According to the method using the battery model expressions as described in the foregoing, the voltage-derived state of charge Cv can correctly be estimated even in the circumstances where the open-circuit voltage value Vo cannot be acquired. The battery model expressions effectively exhibit a self-repair function for automatically eliminating an SOC estimation error by repeating a calculation cycle during the period when the state of charge C fluctuates to some extent. In other words, even when calculation is started with the voltage-derived state of charge Cv including an SOC estimation error, the SOC estimation error included in the early stages is gradually eliminated by continuously estimating the voltage-derived state of charge Cv for a fixed period of time or more with use of the battery model expressions.

As described before and as described in FIG. 3, the SOC-OCV curve of the battery 12 in the embodiment has a partially significant hysteresis. That is, in FIG. 3, a solid line represents a SOC-OCV curve obtained in the process of charging after the battery 12 is fully discharged. The curve is what is called a SOC-OCV curve after continuation of charging. Hereinafter, the curve is called "charging OCV" or "OCV_ch." A chain line is a SOC-OCV curve obtained in the process of discharging after the battery 12 is fully charged. The curve is what is called an OCV-OCV curve after continuation of discharging. Hereinafter, the curve is called "discharging OCV" or "OCV_dis."

As is clear from FIG. 3, in a high SOC region where the state of charge Cb is relatively high, there is almost no difference between OCV_dis and OCV_ch, and therefore there is no significant hysteresis in the region. In a low SOC region where the state of charge Cb is relatively low, OCV_dis is different from OCV_ch by a certain value or more, and therefore a significant hysteresis occurs. Hereinafter, the region where the significant hysteresis does not occur is called "non-hysteresis region." The region where the significant hysteresis occurs is called "hysteresis region." Furthermore, the state of charge serving as a boundary between the non-hysteresis region and the hysteresis region is called a boundary state of charge C_b.

In the non-hysteresis region, when the value of the open-circuit voltage value Vo is identical, the value of the state of charge C after continuation of discharging is considered to be identical to the value of the state of charge C after continuation of charging. In other words, when the state of charge C of the battery 12 is in the non-hysteresis region, the state of charge C can be estimated with sufficient accuracy from the voltage value. In the hysteresis region, even when the value of the open-circuit voltage value Vo is identical, the corresponding states of charge C after continuation of discharging and after continuation of charging are different. For example, when the open-circuit voltage value Vo=V2, the state of charge C=Co after continuation of discharging, and the state of charge C=Ci after continuation of charging. In other words, when the state of charge C of the battery 12 is in the hysteresis region, it becomes difficult to estimate the state of charge C from the voltage value with sufficient accuracy. In short, the voltage-derived state of charge Cv has high reliability in the non-hysteresis region, whereas its reliability deteriorates in the hysteresis region.

The Ce calculation unit 36 calculates a control state of charge Ce that is referred to when charge and discharge control of the battery 12 is performed. The control state of charge Ce is obtained by weighing and adding the electric current-derived state of charge Ci estimated by the Ci estimation unit and the voltage-derived state of charge Cv estimated by the Cv estimation unit 34. That is, Ce=Ki×Ci+ Kv×Cv. Ki and Kv are addition ratios, and Ki+Kv=1. The addition ratios Ki, Kv change in accordance with the state of charge C of the battery 12.

Figure 6:
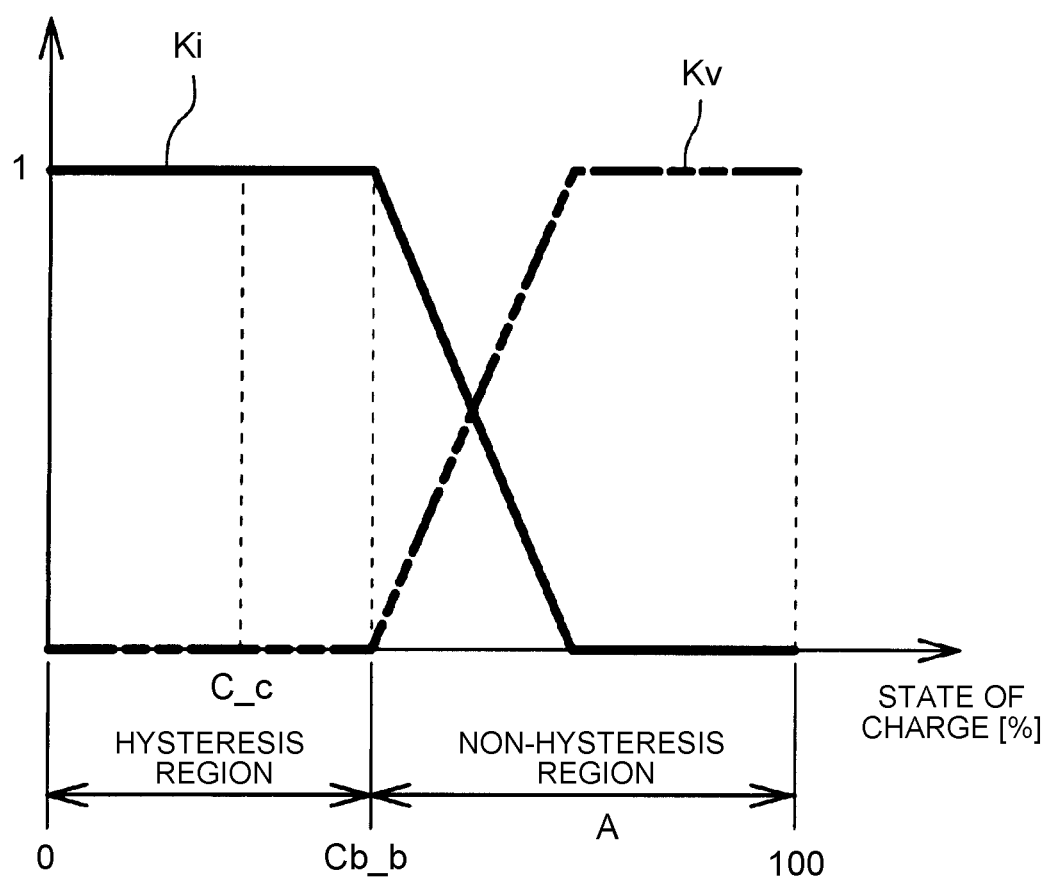
FIG. 6 illustrates one example of an addition ratio map.

FIG. 6 illustrates one example of an addition ratio map, where a horizontal axis indicates the state of charge C. As illustrated in FIG. 6, in the hysteresis region where the state of charge C becomes equal to or below the boundary state of charge C_b, the addition ratio Ki of the electric current-derived state of charge Ci=1, and the addition ratio of the voltage-derived state of charge Kv=0. When the state of charge C exceeds the boundary state of charge Cb_b, the addition ratio Ki is gradually decreased and the addition ratio Kv is gradually increased to Ki=0 and Kv=1.

In this way, a weight coefficient K is variable because the reliability of the voltage-derived state of charge Cv changes in accordance with the state of charge C. That is, as described in the foregoing, the value of the state of charge C with respect to the open-circuit voltage value Vo is not uniquely defined in the hysteresis region. As a result, the accuracy of the voltage-derived state of charge Cv deteriorates. Accordingly, in the hysteresis region, the addition ratio Kv of the voltage-derived state of charge Cv is decreased. Meanwhile, in the non-hysteresis region where the reliability of the voltage-derived state of charge Cv increases, the addition ratio Kv of the voltage-derived state of charge Cv is increased.

In the example of FIG. 6, Ki=1 and Kv=0 in the hysteresis region. However, Ki and Kv may take other values as long as the addition ratio Ki of the electric current-derived state of charge Ci is higher than the addition ratio Kv of the voltage-derived state of charge Cv, (as long as Ki>Kv). For example, in the hysteresis region, Ki=0.8 and Kv=0.2 may be set. Although Ki=1 and Kv=0 in the high SOC region in the example of FIG. 6, Ki and Kv may take other values. Therefore, Ki=0.5 and Kv=0.5 may be set in the high SOC region, for example.

The addition ratio map as illustrated in FIG. 6 is stored in the memory 28. The Ce calculation unit 36 applies the current state of charge C (a control state of charge Ce one sampling period before to be specific) to the addition ratio map stored in the memory 28 to identify the addition ratios Ki, Kv. The Ce calculation unit 36 outputs as the control state of charge Ce a value obtained by weighing and adding the electric current-derived state of charge Ci and the voltage-derived state of charge Cv with use of the addition ratios Ki, Kv.

The Ci correction unit 38 corrects the electric current-derived state of charge Ci estimated by the Ci estimation unit 32 with the voltage-derived state of charge Cv estimated by the Cv estimation unit 34. That is, the electric current-derived state of charge Ci is not influenced by the hysteresis, though it is influenced by an integration error included in an electric current integrated value $\Delta$Ah derived from an error of the electric current sensor. Therefore, the reliability of the electric current-derived state of charge Ci gradually decreases with the passage of time (with the increase of electric current integrated value $\Delta$Ah). Meanwhile, the voltage-derived state of charge Cv has low reliability in the hysteresis region, though it has high reliability in the non-hysteresis region. Accordingly, when determining that a large integration error is included in the electric current-derived state of charge Ci and therefore correction of the electric current-derived state of charge Ci is necessary, the Ci correction unit 38 corrects the electric current-derived state of charge Ci based on the voltage-derived state of charge Cv estimated in the non-hysteresis region. A specific method for correcting the electric current-derived state of charge Ci will be described later in detail. When determining that correction is necessary, the Ci correction unit 38 instructs a travel mode switch unit 40 to shift to the non-hysteresis region in order to obtain the voltage-derived state of charge Cv estimated in the non-hysteresis region.

The travel mode switch unit 40 switches the travel mode of the electric motor vehicle 100 as needed. The travel mode of the electric motor vehicle 100 includes an EV travel mode, an HV travel mode, and an engine travel mode.

The EV travel mode is a mode where the vehicle travels with only the motive power of the second rotary electric machine MG2 while the engine 104 is stopped. In the EV travel mode, the discharge amount of the battery 12 generally exceeds the charge amount, so that the state of charge C of the battery 12 decreases.

In the HV travel mode, the vehicle travels with the motive power of the engine 104 and the second rotary electric machine MG2, while the first rotary electric machine MG1 generates electric power with surplus motive power of the engine 104. Since discharge and charge of the battery 12 are generally performed in the HV travel mode, fluctuation of the state of charge C of the battery 12 is kept to be relatively small.

In the engine travel mode, driving of the second rotary electric machine MG2 is stopped, and the vehicle travels only with the motive power of the engine 104. The engine travel mode further includes an overcharge mode and a charge-discharge suppression mode. In the overcharge mode, the motive power equal to or above the request motive power of the vehicle is output from the engine 104, and the first rotary electric machine MG1 generates electric power with the surplus motive power of the engine 104. In the overcharge mode, the charge amount of the battery 12 exceeds the discharge amount, so that the state of charge C of the battery 12 gradually increases. The charge-discharge suppression mode is a mode in which the motive power corresponding to the request motive power of the vehicle is output from the engine 104 to suppress operation of the first and second rotary electric machines MG1, MG2 as much as possible. In the charge-discharge suppression mode, the electric current input to and output from the battery 12 becomes small, which makes it easy to acquire the open-circuit voltage Vo.

The travel mode switch unit 40 selects the travel mode based on parameters such as the operating state (for example, the stepping-in amount of an accelerator pedal, etc.) of the vehicle 100, and the state of charge C of the battery 12. The travel mode switch unit 40 also switches the travel mode in response to an instruction from the Ci correction unit 38.

A description is now given of the correction of the electric current-derived state of charge Ci. As described in the foregoing, the electric current-derived state of charge Ci is the state of charge estimated with reference to the electric current integrated value $\Delta$Ah. The electric current-derived state of charge Ci is hardly influenced by the hysteresis, though it is influenced by an integration error EE included in the electric current integrated value $\Delta$Ah derived from the electric current sensor, since the electric current-derived state of charge Ci is estimated with reference to the electric current integrated value ΔAh obtained by integrating the detected electric current values Ib.

The error included in the detected electric current value Ib includes an accidental error E1 attributed to noise and the like, an offset error E2 generated when a detection value deviates by a specified value from a true value, and a gain error E3 generated when the detection value proportionally deviates from the true value. Among the errors, an integrated value ΣE1 of the accidental errors gradually approaches zero over a long integration process. An integrated value ΣE2 of the offset errors does not approach zero, but an absolute value thereof gradually increases when integration continues. An integrated value ΣE3 of the gain errors has its absolute value gradually increasing when the charge and discharge deviates. Therefore, the electric current integrated value ΔAh and by extension, the electric current-derived state of charge Ci estimated with reference to the electric current integrated value ΔAh, have a larger error and lower accuracy, as integration time and the electric current integrated value ΔAh become larger.

Accordingly, the Ci correction unit 38 executes the correction processing for correcting the electric current-derived state of charge Ci based on the voltage-derived state of charge Cv as necessary. However, it is important that the voltage-derived state of charge Cv referred to in the correction processing correctly represents the state of the battery 12. As described before, the reliability of the voltage-derived state of charge Cv deteriorates in the hysteresis region, whereas the reliability of the voltage-derived state of charge Cv is high in the non-hysteresis region, and therefore it can be assumed that the voltage-derived state of charge Cv correctly represents the state of the battery 12 in the non-hysteresis region. Accordingly, in correcting the electric current-derived state of charge Ci, the Ci correction unit 38 refers to the voltage-derived state of charge Cv acquired when the state of charge C of the battery 12 is in the non-hysteresis region.

Figure 7:
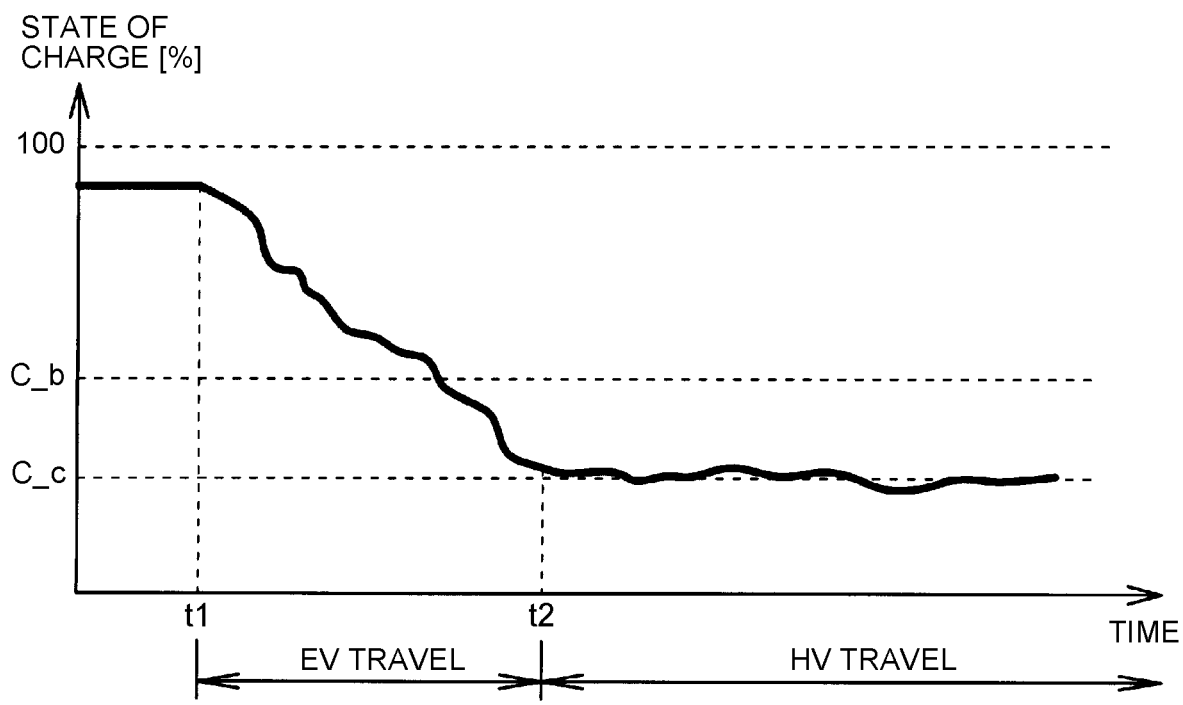
FIG. 7 illustrates an example of operation in a hybrid vehicle.

In this case, in order to correct the electric current-derived state of charge Ci, the state of charge C of the battery 12 needs to be in the non-hysteresis region. However, when hybrid travel is continued mainly in the low SOC region, the state of charge C is less frequently in the non-hysteresis region, which makes it difficult to grab an opportunity of correcting the electric current-derived state of charge Ci. The difficulty will be described with reference to FIG. 7. FIG. 7 illustrates one example of typical change in the state of charge C in a hybrid vehicle, and a plug-in hybrid vehicle in particular. In the example illustrated in FIG. 7, the vehicle starts to travel in the state where external charging to the battery 12 is completed, i.e., in the state where the state of charge C is close to the fully-charged state (for example, 90%).

When the state of charge C is high, such as immediately after external charging, the control unit 14 actively executes the EV travel to decrease the state of charge C to around an intermediate value C_c (for example, 30%). Once the state of charge C of the battery 12 decreases to around the intermediate value C_c, the control unit 14 then actively executes the HV travel such that the state of charge C of the battery 12 is maintained around the intermediate value C_c.

In the example illustrated in FIG. 7, the power of the vehicle is turned on at time t1 after completion of the external charging. At that time, since the state of charge C of the battery 12 is sufficient higher than the intermediate value C_c, the control unit 14 actively executes the EV travel. Accordingly, the state of charge C decreases to around the intermediate value C_c. When the state of charge C decreases to around the intermediate value C_c at time t2, then the control unit 14 actively executes the HV travel such that the change in the state of charge C becomes smaller.

Here, the intermediate value C_c is generally smaller than the boundary state of charge C_b, and is in the hysteresis region. Accordingly, during hybrid travel, the timing when the state of charge C is in the non-hysteresis region, in other words, the timing when the electric current-derived state of charge Ci can be corrected with the voltage-derived state of charge Cv, hardly occurs.

Accordingly, when determining that correction of the electric current-derived state of charge Ci is necessary, the Ci correction unit 38 instructs the travel mode switch unit 40 to change the travel mode so as to actively shift the state of charge C to the non-hysteresis region.

Figure 8:
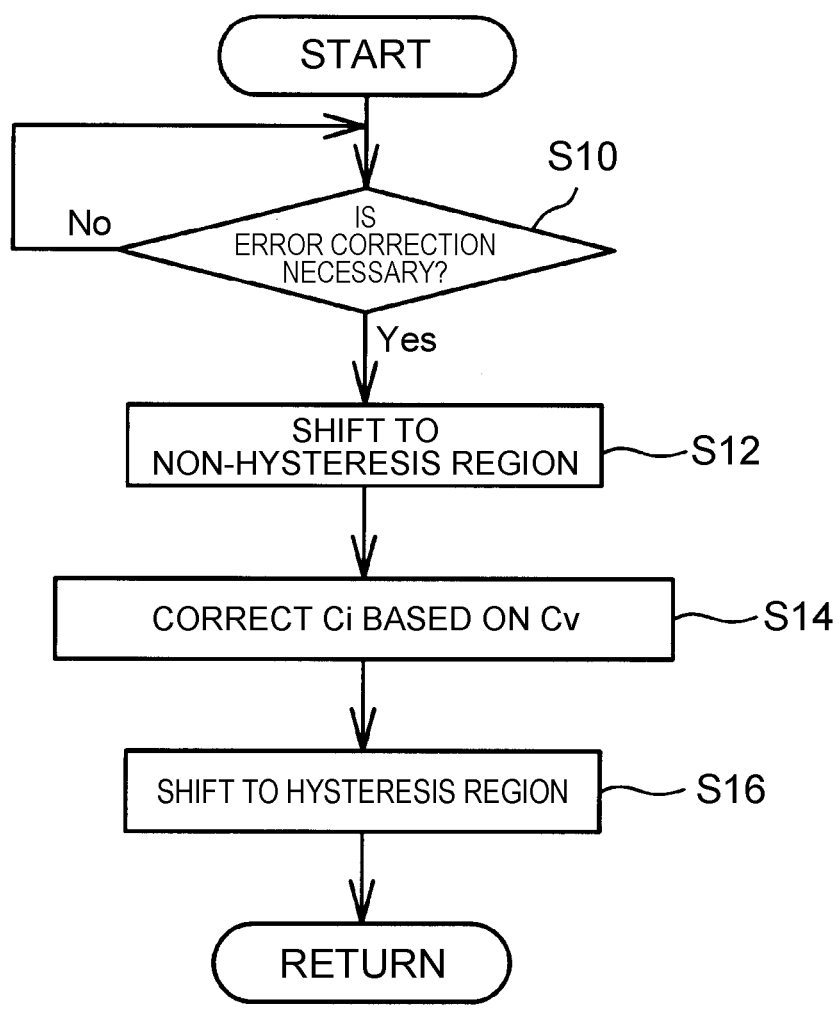
FIG. 8 is a flowchart illustrating the flow of correcting an electric current-derived state of charge.

The specific flow of correcting the electric current-derived state of charge Ci will be illustrated with reference to FIG. 8. FIG. 8 is a flowchart illustrating the flow of correcting the electric current-derived state of charge Ci. The Ci correction unit 38 determines the necessity of correcting the electric current-derived state of charge Ci in every specified control period (S10). The necessity of correction may be determined based on various factors. For example, when lapsed time te from previous correction becomes equal to or above a predefined reference time tdef (for example, several hours), it may be determined that the electric current-derived state of charge Ci needs to be corrected. In another aspect, when the electric current integrated value ΔAh becomes equal to or above a predefined reference integrated value ΔAhdef, it may be determined that correction is necessary. This is because the integration error included in the electric current-derived state of charge Ci becomes larger, as the electric current integrated value ΔAh is larger. The reference time tdef and the reference integrated value ΔAhdef may also be changed as needed. For example, error characteristics of the electric current sensor 20 may change in accordance with temperature. Accordingly, the reference time tdef and the reference integrated value ΔAhdef may be changed in accordance with the battery temperature Tb. Furthermore, the necessity of correction may be determined based on a parameter formed by combining the lapsed time te and the electric current integrated value ΔAh. For example, the necessity of correction may be determined based on a value obtained by multiplying the electric current integrated value ΔAh by a proportionality coefficient that becomes larger as the lapsed time te becomes larger.

When determining that correction of the electric current-derived state of charge Ci is necessary, the Ci correction unit 38 shifts the control state of charge Ce of the battery 12 to the non-hysteresis region (S12). Specifically, the Ci correction unit 38 instructs the travel mode switch unit 40 to switch to the overcharge mode. When the travel mode of the vehicle is switched to the overcharge mode in response to the instruction, the control state of charge Ce gradually increases.

When the control state of charge Ce reaches the non-hysteresis region, the Ci correction unit 38 corrects the electric current-derived state of charge Ci based on the voltage-derived state of charge Cv (S14). As long as the electric current-derived state of charge Ci is corrected based on the voltage-derived state of charge Cv estimated in the non-hysteresis region, the correcting method is not particularly limited. For example, based on the voltage-derived state of charge Cv, the starting state of charge C_0 at integration start time may be corrected. That is, the electric current-derived state of charge Ci is calculated as a value obtained by adding to the state of charge C_0 at the integration start time the change amount ΔC of the state of charge calculated from the electric current integrated value ΔAh obtained by integrating the electric current values from the integration start time as described before. As the need arises, the voltage-derived state of charge Cv may be set as a new starting state of charge C_0, and integration of the detected electric current value Ib may be started at that timing. Based on the voltage-derived state of charge Cv, the electric current-derived state of charge Ci may gradually be corrected.

In another aspect, as disclosed in Japanese Patent Laid-Open No. 2005-261130 and the like, the offset error E2 may be identified based on comparison between the change in the voltage-derived state of charge Cv and the change in the electric current integrated value ΔAh. To be more specific, the change amount of the electric current integrated value ΔAh may be regarded as a change amount ΔFi of the charging capacity. Since the voltage-derived state of charge Cv may be regarded as a change rate of the charging capacity, a value obtained by multiplying the change amount of the voltage-derived state of charge Cv by the full-charge capacity FCC may be regarded as the change amount of the charging capacity. When the voltage-derived state of charge Cv correctly represents the state of the battery 12, a difference value (ΔFi−ΔFv) between the change amount ΔFi of the charging capacity obtained from the electric current integrated value ΔAh and the change amount ΔFv of the charging capacity obtained from the voltage-derived state of charge Cv may be regarded as an integration error ΣE included in the electric current integrated value ΔAh. Accordingly, the difference value (ΔFi−ΔFv) between the change amount ΔFi of the charging capacity obtained from the electric current integrated value ΔAh and the change amount ΔFv of the charging capacity obtained from the voltage-derived state of charge Cv is obtained during a certain period T. Then, the obtained difference value is divided by the period T to acquire a value used as a candidate value of the offset error E2. The calculation of the candidate value of the offset error E2 is performed a plurality of times in the non-hysteresis region, and an average value of a plurality of obtained candidate values is output as the offset error E2. However, when the electric current integrated value ΔAh is large, it tends to include the influence of the gain error E3. Accordingly, calculation of the offset error E2 is preferably executed when the electric current integrated value ΔAh is a specified value or below.

As is clear from the above description, the voltage-derived state of charge Cv is referred to in correcting the electric current-derived state of charge Ci. The voltage-derived state of charge Cv may be estimated by applying the open-circuit voltage value Vo to the SOC-OCV curve, or may be estimated with use of the battery model expressions as described in the foregoing. In any case, a significant hysteresis does not occur in the change characteristics of the open-circuit voltage Vo with respect to the state of charge C in the non-hysteresis region. Accordingly, it can be said that the reliability of the voltage-derived state of charge Cv estimated in the non-hysteresis region is high. Based on the highly reliable voltage-derived state of charge Cv, the electric current-derived state of charge Ci is corrected, so that the estimation accuracy of the electric current-derived state of charge Ci and by extension, the estimation accuracy of the control state of charge Ce can further be enhanced.

When the electric current-derived state of charge Ci can be corrected, the Ci correction unit 38 shifts the control state of charge Ce of the battery 12 to the vicinity of the intermediate value C_c (S16). Specifically, the Ci correction unit 38 instructs the travel mode switch unit 40 to switch to the overcharge mode such as the EV travel. When the travel mode of the vehicle is switched in response to the instruction, the control state of charge Ce gradually decreases. When the control state of charge Ce reaches the vicinity of the intermediate value C_c, the Ci correction unit 38 instructs the travel mode switch unit 40 to switch to the HV travel mode. When the travel mode of the vehicle is switched to the HV travel mode in response to the instruction, the control state of charge Ce is maintained around the intermediate value C_c, without exhibiting a large change. When all the processing steps are finished, the processing returns to step S10, and the same processing is repeated for the electric current-derived state of charge Ci.

Figure 9:
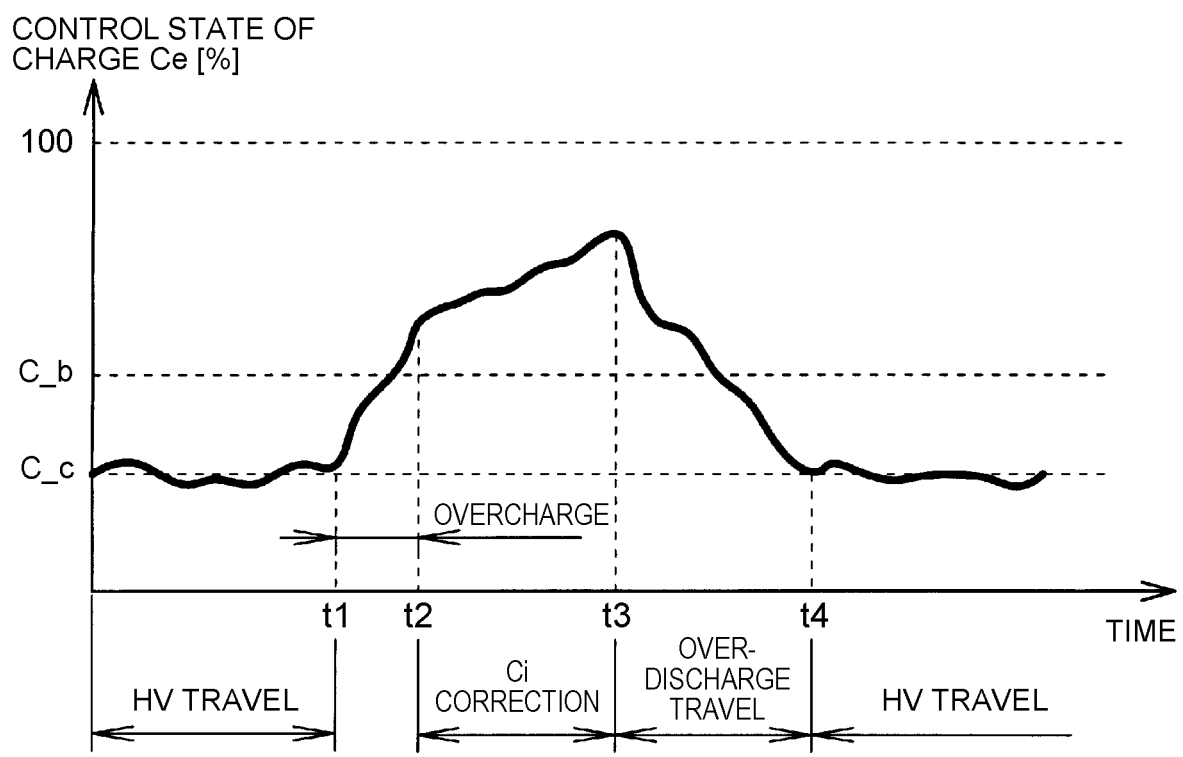
FIG. 9 illustrates one example of correcting operation of the electric current-derived state of charge.

FIG. 9 illustrates an example of correcting operation of the electric current-derived state of charge Ci. In FIG. 9, a horizontal axis indicates time, and a vertical axis indicates the control state of charge Ce. In FIG. 9, when determining that correction of the electric current-derived state of charge Ci is necessary at time t1, the control unit 14 forcibly shifts the control state of charge Ce of the battery 12 to the non-hysteresis region. Specifically, the control unit 14 changes the travel mode of the vehicle 100 to the overcharge mode. As a consequence, the control state of charge Ce of the battery 12 gradually increases. At time t2, when the control state of charge Ce reaches the non-hysteresis region, the control unit 14 corrects the electric current-derived state of charge Ci based on the voltage-derived state of charge Cv acquired in the non-hysteresis region.

The travel mode of the vehicle during the correction period of the electric current-derived state of charge Ci is not particularly limited, as long as the control state of charge Ce falls within the non-hysteresis region. Therefore, in the case of estimating the voltage-derived state of charge Cv based on the SOC-OCV curve for example, the travel mode may periodically be switched to the charge-discharge suppression mode for easy measurement of the open-circuit voltage value Vo. In the battery model expressions, the estimation accuracy is enhanced when the state of charge C of the battery 12 fluctuates to some extent. In the case of estimating the offset error E2 based on the change in the voltage-derived state of charge Cv and the change in the electric current integrated value ΔAh, the change amount of the state of charge C of the battery 12 and by extension, the electric current integrated value ΔAh are desirably equal to or below specified amounts. Therefore, in this case, it is desirable to select, for example, the HV travel mode or the like.

At time t3, when correction of the electric current-derived state of charge Ci is completed, the control unit 14 changes the travel mode of the vehicle 100 to the overdischarge travel mode, such as the EV travel mode. Accordingly, the battery 12 is in an overdischarging state, so that the control state of charge Ce rapidly decreases. Then, at time t4, when the control state of charge Ce reaches the intermediate value C_c, the control unit 14 changes the travel mode to the HV travel mode. As a result, the control state of charge Ce is maintained around the intermediate value C_c.

As is clear from the above description, in the battery system disclosed in the present specification, the electric current-derived state of charge Ci is corrected based on the voltage-derived state of charge Cv estimated in the non-hysteresis region. As a result, the estimation accuracy of the electric current-derived state of charge Ci and by extension, the control state of charge Ce can further be enhanced, without being influenced by the hysteresis. When it is determined that correction of the electric current-derived state of charge Ci is necessary, the charge and discharge of the battery 12 is controlled to forcibly shift the state of charge C to the non-hysteresis region. Accordingly, the electric current-derived state of charge Ci can be corrected at adequate timing.

The configuration described in the foregoing is merely an example. As long as the electric current-derived state of charge Ci is corrected based on the voltage-derived state of charge Cv estimated in the non-hysteresis region, other configurational aspects may properly be changed. For example, in the present specification, the battery 12 has a negative electrode active material containing a silicon-based material and graphite. However, the technology disclosed in the present specification is applicable to secondary batteries of other types as long as the secondary batteries have a partially significant hysteresis. For example, the technology disclosed in the present specification may be applied to a lithium-ion secondary battery having a negative electrode active material containing a silicon-based material and lithium titanate. In the case of the lithium-ion secondary battery containing the silicon-based material and lithium titanate, a hysteresis occurs in the high SOC region. Therefore, in the case of using the lithium-ion secondary battery, the low SOC region may be set as the non-hysteresis region. The electric current-derived state of charge Ci may be corrected based on the voltage-derived state of charge Cv estimated in the low SOC region (non-hysteresis region). The technology disclosed in the present specification may be applied not only to the lithium-ion secondary batteries but also to secondary batteries of other types, such as nickel-hydrogen secondary batteries.

The hysteresis of the SOC-OCV tends to occur in the batteries having an active material containing a material having a large volume change (expansion and contraction). Examples of the negative electrode material include silicon-based compounds (such as Si and SiO), tin-based compounds (Sn, SnO), germanium-based compounds, and lead-based compounds formed by alloying lithium. Here, the change in the volume of graphite used as a negative electrode material of the lithium ion battery is generally about 10%. "The material having a large volume change" that may cause a hysteresis of the SOC-OCV may be a material having a volume change larger than that of graphite (a volume change larger than 10%).

Or alternatively, conversion materials (such as CoO, FeO, NiO, and $Fe_2O_3$) represented by Expression 13 may be used as a negative electrode material. In Expression 13, M indicates transition metal, and X indicates O, F, N, S, and the like.

$$nLi^+ + ne^- + M^{n+}X_{m} \leftrightarrow M + nLiX_{m/n} \quad (13)$$

A conversion material like FeF3 may be used for the positive electrode. Although the case where a hysteresis of the SOC-OCV occurs due to the negative electrode material is illustrated in the present specification, the technology disclosed in the present specification can be applied to the case where the hysteresis occurs due to the positive electrode material.

In the present specification, the battery system 10 mounted on a hybrid vehicle has been described as an example. However, the battery system disclosed in the present specification may be mounted on other electric motor vehicles. For example, the battery system disclosed in the present specification may be mounted on vehicles such as electric vehicles not equipped with the engine, and fuel cell electric vehicles equipped with a fuel cell in addition to the battery 12 as an energy source.

What is claimed is:

1. A method for estimating a state of charge of a battery, the battery being mounted on a vehicle and configured to perform charge and discharge, a charge level range of the battery including a hysteresis region and a non-hysteresis region, the hysteresis region being a charge level range where a significant hysteresis occurs, the significant hysteresis being hysteresis in which open-circuit voltage values with respect to a charge level of the battery after continuation of charging and after continuation of discharging are different from each other by a predetermined value or more, the non-hysteresis region being a charge level range where the significant hysteresis does not occur, the vehicle including an electronic control unit, the method comprising:
estimating, by the electronic control unit, a third state of charge used for control of the battery based on a first state of charge and a second state of charge, the first state of charge being a state of charge estimated with reference to an electric current integrated value obtained by integrating detected electric current values of the battery, the second state of charge being a state of charge estimated with reference to a detected voltage value of the battery; and
correcting, by the electronic control unit, the first state of charge based on the second state of charge estimated when a state of charge of the battery is in the non-hysteresis region.

2. The method according to claim 1, further comprising:
determining, by the electronic control unit, whether or not to correct the first state of charge; and
controlling, by the electronic control unit, charge and discharge of the battery to forcibly shift the state of charge of the battery to the non-hysteresis region, when the electronic control unit determines that correcting the first state of charge is necessary.

3. The method according to claim 2, wherein determining whether or not to correct the first state of charge includes determining whether or not to correct the first state of charge based on at least one of lapsed time after execution of a previous correction of the first state of charge and the integrated electric current value after execution of the previous correction of the first state of charge.

4. The method according to claim 1, wherein
the battery is mounted on one of a hybrid vehicle and a fuel cell electric vehicle, the hybrid vehicle being equipped with an engine and a rotary electric machine as a power source, the fuel cell electric vehicle being equipped with a fuel cell,
the battery is configured to supply electric power to the rotary electric machine.

5. The method accordingly to claim 1, wherein
in estimating the state of charge, the third state of charge is calculated as a value obtained by weighing and adding the first state of charge and the second state of charge, and
when the state of charge is within the hysteresis region, an addition ratio of the first state of charge is larger than the addition ratio of the second state of charge.

6. The method according to claim 5, wherein the addition ratio of the second state of charge is larger when the state of charge is in the hysteresis region than when the state of charge is in the non-hysteresis region.

7. A battery system, comprising:
a battery mounted on a vehicle and configured to perform charge and discharge, a charge level range of the battery including a hysteresis region and a non-hysteresis region, the hysteresis region being a charge level range where a significant hysteresis occurs, the significant hysteresis being hysteresis in which open-circuit voltage values with respect to a charge level of the battery after continuation of charging and after continuation of discharging are different from each other by a predetermined value or more, the non-hysteresis region being a charge level range where the significant hysteresis does not occur;
a voltage detector configured to detect a voltage value of the battery as a detected voltage value;
current detector configured to detect a value of electric current flowing through the battery as a detected electric current value; and
an electronic control unit configured to
control the charge and discharge of the battery and to estimate a current state of charge,
estimate the current state of charge as a first state of charge with reference to an electric current integrated value obtained by integrating the detected electric current values,
estimate the current state of charge as a second state of charge with reference to the detected voltage value, and
correct the first state of charge based on the second state of charge estimated with reference to the detected voltage value detected when a state of charge of the battery is in the non-hysteresis region.

* * * * *

UNITED STATES PATENT AND TRADEMARK OFFICE
CERTIFICATE OF CORRECTION

Page 1 of 1

PATENT NO. : 10,838,011 B2
APPLICATION NO. : 15/963531
DATED : November 17, 2020
INVENTOR(S) : Kenji Takahashi It is certified that error appears in the above-identified patent and that said Letters Patent is hereby corrected as shown below:

On the Title Page

Item (73) Assignee; Please delete "TOYOTDA JIDOSHA KABUSHIKI KAISHA, Aichi-ken (JP)" and insert -- TOYOTA JIDOSHA KABUSHIKI KAISHA, Aichi-ken (JP) --

Signed and Sealed this
Twelfth Day of January, 2021

Andrei Iancu
*Director of the United States Patent and Trademark Office*